(12) United States Patent
Goldan et al.

(10) Patent No.: US 9,553,220 B2
(45) Date of Patent: Jan. 24, 2017

(54) FIELD-SHAPING MULTI-WELL AVALANCHE DETECTOR FOR DIRECT CONVERSION AMORPHOUS SELENIUM

(71) Applicant: The Research Foundation for The State University of New York, Albany, NY (US)

(72) Inventors: Amirhossein Goldan, Middle Island, NY (US); Wei Zhao, East Setauket, NY (US)

(73) Assignee: The Research Foundation for The State University of New York, Albany, NY (US)

( * ) Notice: Subject to any disclaimer, the term of this patent is extended or adjusted under 35 U.S.C. 154(b) by 0 days.

(21) Appl. No.: 14/414,607

(22) PCT Filed: Jul. 19, 2013

(86) PCT No.: PCT/US2013/051351
§ 371 (c)(1),
(2) Date: Jan. 13, 2015

(87) PCT Pub. No.: WO2014/015285
PCT Pub. Date: Jan. 23, 2014

(65) Prior Publication Data
US 2015/0171232 A1 Jun. 18, 2015

Related U.S. Application Data

(60) Provisional application No. 61/673,484, filed on Jul. 19, 2012.

(51) Int. Cl.
*H01L 25/00* (2006.01)
*H01L 31/0272* (2006.01)
(Continued)

(52) U.S. Cl.
CPC ..... *H01L 31/0272* (2013.01); *H01L 27/14603* (2013.01); *H01L 31/0376* (2013.01); *H01L 31/107* (2013.01); *H01L 31/115* (2013.01)

(58) Field of Classification Search
CPC .. G01T 1/24; H01L 27/14676; H01L 31/0304; H01L 31/109; Y02E 10/544
See application file for complete search history.

(56) References Cited

U.S. PATENT DOCUMENTS

| 4,472,728 A | 9/1984 | Grant et al. |
| 4,577,322 A | 3/1986 | Partin |

(Continued)

FOREIGN PATENT DOCUMENTS

| JP | 201034166 | 2/2010 |
| JP | 2011216769 | 10/2011 |

(Continued)

OTHER PUBLICATIONS

PCT/ISA/237 Written Opinion issued on PCT/US2013/051351 (pp. 7).

(Continued)

*Primary Examiner* — David Porta
*Assistant Examiner* — Mamadou Faye
(74) *Attorney, Agent, or Firm* — The Farrell Law Firm, P.C.

(57) ABSTRACT

A field shaping multi-well avalanche detector and method for fabrication thereof are disclosed. The field shaping multi-well avalanche detector provides stable avalanche multiplication gain in direct conversion amorphous selenium radiation detectors. The detector provides stable avalanche multiplication gain by eliminating field hot-spots using high-density avalanche wells with insulated wells and field-shaping within each well.

15 Claims, 7 Drawing Sheets

(51) Int. Cl.
  *H01L 31/107*   (2006.01)
  *H01L 27/146*   (2006.01)
  *H01L 31/0376*  (2006.01)
  *H01L 31/115*   (2006.01)

(56) References Cited

U.S. PATENT DOCUMENTS

| | | | |
|---|---|---|---|
| 4,996,432 | A | 2/1991 | Saitou |
| 5,198,673 | A * | 3/1993 | Rougeot ........... H01L 27/14663 |
| | | | 250/370.09 |
| 5,530,249 | A | 6/1996 | Luke |
| 5,627,377 | A | 5/1997 | Hamilton, Jr. et al. |
| 5,677,539 | A | 10/1997 | Apotovsky et al. |
| 5,804,475 | A | 9/1998 | Meyer et al. |
| 5,886,353 | A | 3/1999 | Spivey et al. |
| 5,905,264 | A | 5/1999 | Shahar et al. |
| 6,043,495 | A | 3/2000 | Verger et al. |
| 6,069,360 | A | 5/2000 | Lund |
| 6,175,120 | B1 | 1/2001 | McGregor et al. |
| 6,218,668 | B1 | 4/2001 | Luke |
| 6,344,650 | B1 | 2/2002 | Lee et al. |
| 6,350,989 | B1 | 2/2002 | Lee et al. |
| 6,890,809 | B2 | 5/2005 | Karpov et al. |
| 7,256,402 | B1 * | 8/2007 | Lee ........................ G01T 1/241 |
| | | | 250/370.09 |
| 7,271,395 | B2 | 9/2007 | DeGeronimo |
| 7,372,035 | B2 | 5/2008 | Yokoi et al. |
| 7,541,605 | B2 | 6/2009 | Takahashi |
| 7,608,830 | B1 | 10/2009 | Kinch |
| 7,649,177 | B2 | 1/2010 | Imai |
| 7,741,147 | B2 | 6/2010 | Kiesel et al. |
| 8,129,688 | B2 | 3/2012 | Karim et al. |
| 8,415,662 | B2 | 4/2013 | Ogusu et al. |
| 2004/0057556 | A1 | 3/2004 | Luhta et al. |
| 2006/0054835 | A1 | 3/2006 | Rowlands et al. |
| 2007/0108398 | A1 | 5/2007 | Imai |

FOREIGN PATENT DOCUMENTS

| | | |
|---|---|---|
| KR | 1020100001639 | 1/2010 |
| WO | WO 2011/041750 | 4/2011 |

OTHER PUBLICATIONS

PCT/ISA/210 Search Report issued on PCT/US2013/051351 (pp. 3).

Charpak, G. et al., High Accuracy, Two-Dimensional Read-Out in Multiwire Proportional Chambers, CERN European Organization for Nuclear Research, Feb. 14, 1973, (pp. 14).

* cited by examiner

US 9,553,220 B2

FIELD-SHAPING MULTI-WELL AVALANCHE DETECTOR FOR DIRECT CONVERSION AMORPHOUS SELENIUM

PRIORITY

This application claims priority to U.S. Provisional Patent Application No. 61/673,484 filed with the U.S. Patent and Trademark Office on Jul. 19, 2012, the content of which is incorporated herein by reference.

GOVERNMENT SUPPORT

This invention was made with government support under grant number EB002655 awarded by the National Institute of Health. The government has certain rights in the invention.

BACKGROUND OF THE INVENTION

1. Field of the Invention

The present invention relates generally to solid-state imaging detectors of ionizing radiation and, in particular, to amorphous selenium radiation detectors having a field-shaping multi-well avalanche detector structure.

2. Description of the Related Art

Soon after the Nobel Prize winning invention of the gas-filled multi-wire proportional chamber by Charpak in 1968 and parallel to developments in microelectronics, micro-pattern gaseous detectors were developed for improved position resolution. However, the range of radiation induced photoelectrons is micrometer to millimeter in, with gas solid-state detectors having three-orders-of magnitude shorter photoelectron range due to their much higher density. Thus, solid-state detectors yield images with substantially higher spatial/temporal resolution. Disordered solids, which are easier and less expensive to develop than single crystalline solids, have not been utilized as photon-counting mode detection media because of low carrier mobility and transit-time-limited photo response.

Amorphous selenium (a-Se), which was previously developed for photocopying machines, has been commercially revived as a direct x-ray photoconductor for Flat-Panel Detectors (FPD) due to high x-ray sensitivity and uniform evaporation over a large area as a thick film. However, current direct conversion FPDs are limited by, inter alia, degradation of low-dose imaging performance due to electronic noise, because energy required to generate an electron-hole pair in a-Se is 50 eV at 10 V/micron. Although other photoconductive materials with higher conversion have been investigated, the other photoconductive materials suffer from charge trapping and manufacturing issues. Improved conversion of a-Se is possible by increasing the electric field above 30 V/micron, i.e., 30,000 V on a 1000 micron layer. However, this electric field increase is extremely challenging for reliable detector construction and operation, and is virtually impractical.

Amorphous solids, i.e., non-crystalline solids with disorder, have been ruled out as viable radiation imaging detectors in a photon-counting mode because of low temporal resolution due to low carrier mobilities and transit-time limited pulse response, and low conversion gain of high energy radiation to electric charge. Avalanche multiplication in selenium can be used to increase the electric charge gain. However, significant obstacles prevent practical implementation of a direct conversion a-Se layer with separate absorption and avalanche regions.

A separate localized avalanche multiplication region minimizes gain variation compared to bulk avalanche, i.e., avalanche in an entire volume of a-Se. However, a separate localized avalanche multiplication region has not been realized due to formation of field hot-spots, where F exceeds 150 V/μm, leading to irreversible material breakdown. The concept of unipolar solid-state detectors with a Frisch grid has been proposed, but such structures are not practical for direct conversion avalanche gain because the highest electric field in the well develops at the interface between the semiconductor and the pixel electrode, thereby resulting in high dark current due to large charge injection and potentially irreversible detector damage.

Therefore, provided herein is a novel radiation detector that overcomes disadvantages of conventional detectors.

SUMMARY OF THE INVENTION

Accordingly, aspects of the present invention address the above problems and disadvantages and provide the advantages described below. An aspect of the present invention provides practical detector structures without field hot-spots to realize direct conversion avalanche a-Se.

An aspect of the present invention provides a direct conversion amorphous selenium radiation detector structure that achieves stable avalanche multiplication gain and provides high-density insulated wells and field-shaping to eliminate formation of field hot-spots in an avalanche region and high fields at a metal-semiconductor interface to provide a semi-Gaussian field distribution inside each well using field-shaping electrodes and to provide an electric field at the metal-semiconductor interface of one order-of-magnitude lower than a peak value where avalanche occurs, thereby providing a practical direct conversion amorphous selenium detector with avalanche gain, and method for operation thereof.

BRIEF DESCRIPTION OF THE DRAWINGS

The above and other aspects, features and advantages of certain embodiments of the present invention will be more apparent from the following detailed description taken in conjunction with the accompanying drawings, in which.

DETAILED DESCRIPTION OF EMBODIMENTS OF THE INVENTION

The following detailed description of certain embodiments of the present invention will be made with reference to the accompanying drawings. In describing the invention, explanation about related functions or constructions known in the art are omitted for the sake of clearness in understanding the concept of the invention, to avoid obscuring the invention with unnecessary detail.

Disclosed herein is construction of a practical solid-state avalanche radiation detector using an amorphous material as the photoconductive layer that achieves stable and continuous avalanche multiplication gain using field-shaping inside each well, with the avalanche structure also referred to as a Multi-Well Solid-state Detector (MWSD).

Figure 1:
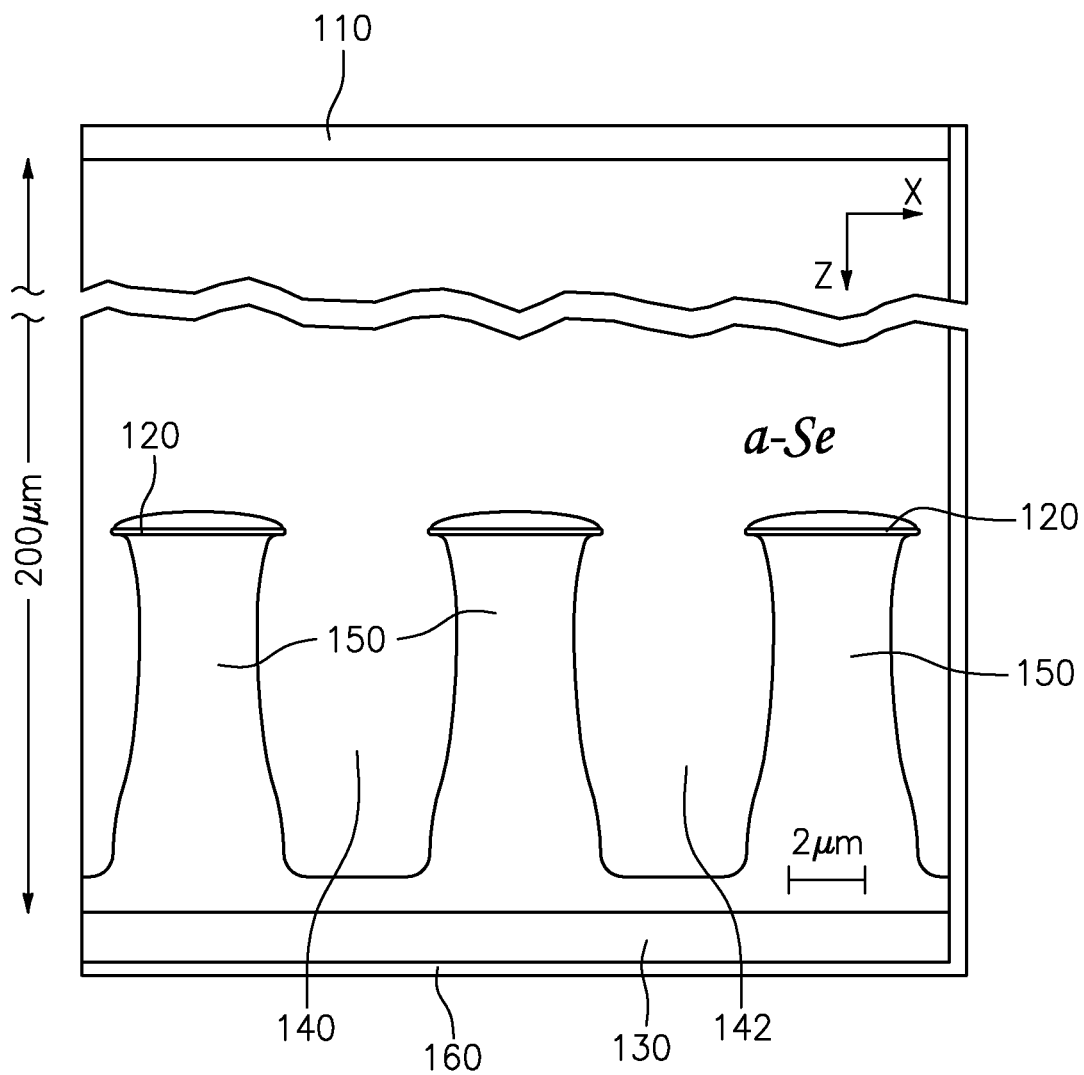
FIG. 1 is a Scanning Electron Microscope cross-section of a Micro Well Solid-state Detector (MWSD)

FIG. 1 is a Scanning Electron Microscope cross-section of a Micro Well Solid-state Detector (MWSD), showing a preferred arrangement of common electrode (110), shield (120), pixel electrode (130), a plurality of insulators (150) with a plurality of wells (140, 142) therebetween, and substrate (160). The MWSD of FIG. 1 substantially improves temporal performance of amorphous selenium using a unipolar time-differential pulse response. However, the MWSD of FIG. 1 is not suitable for avalanche operation because the highest field in the well (140) develops at a selenium-collector interface, resulting in high leakage current due to large charge injection and possibly sparking during discharge. Accordingly, an aspect of the present invention provides a unipolar time-differential property and avalanche multiplication gain that substantially improves temporal resolution and conversion gain. As described herein, the SWAD provides a practical approach to achieve stable avalanche in large-area direct radiation detectors, where low-field interaction regions can be provided with a predetermined thickness to stop high-energy radiation, and a high-field multi-well detection region is optimized for avalanche multiplication.

Figure 2A:
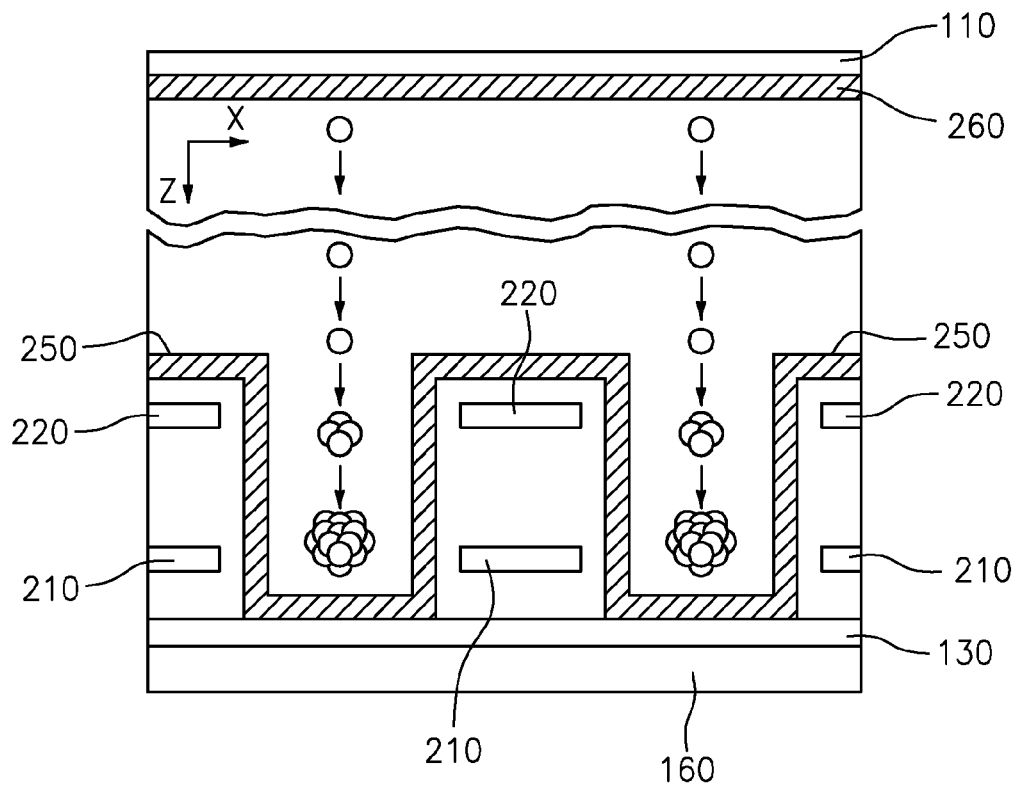
FIG. 2(a) illustrates a double-grid field-shaping avalanche detector according to an aspect of the present invention.
Figure 2B:
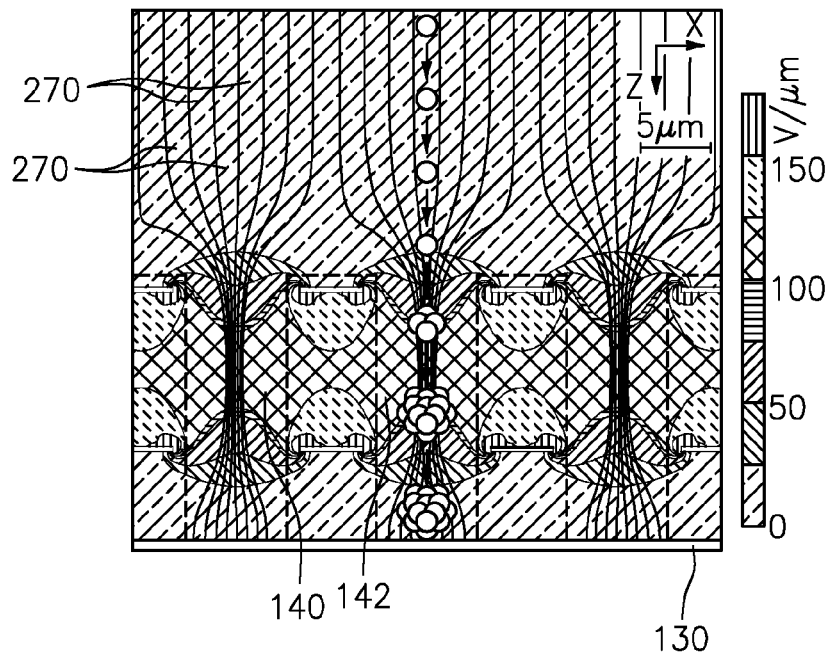
FIG. 2(b) illustrates electric field distribution and streamlines inside wells of the double-grid field-shaping avalanche detector of FIG. 2(a)

FIG. 2(*a*) illustrates a double-grid field-shaping avalanche detector. The modified structure shown in FIG. 2(*a*) is a gas electron multiplier modified from the Charpak multi-wire proportional chamber for discharge-free high-gain avalanche operation. FIG. 2(*b*) illustrates electric field distribution within streamlines (270) within wells (140, 142) of the double-grid field-shaping avalanche detector.

Application of voltages on the common electrode (110), the pixel electrode (130), and the grid electrodes (210 and 220) will create low-field regions between the common electrode (110) and the top grid electrode (220; another low-field region between the bottom grid electrode (210) and the pixel electrode (130); and, finally, an avalanche region between the two grid electrodes, i.e., between top grid electrode (220) and bottom grid electrode (210), as shown in FIGS. 2(*a*)-(*b*).

The avalanche region develops between grids where electric field lines, i.e., streamlines (270), are focused. Streamlines (270) are defocused close to the collector, i.e., the pixel electrode (130) in a low-field region for reducing charge injection from pixel electrode (130), with charge injection occurring from any electrode directly touching the amorphous selenium (a-Se) semiconductor, thereby providing a field-Shaping multi-Well Avalanche Detector (SWAD) according to an aspect of the present invention.

Figure 3:
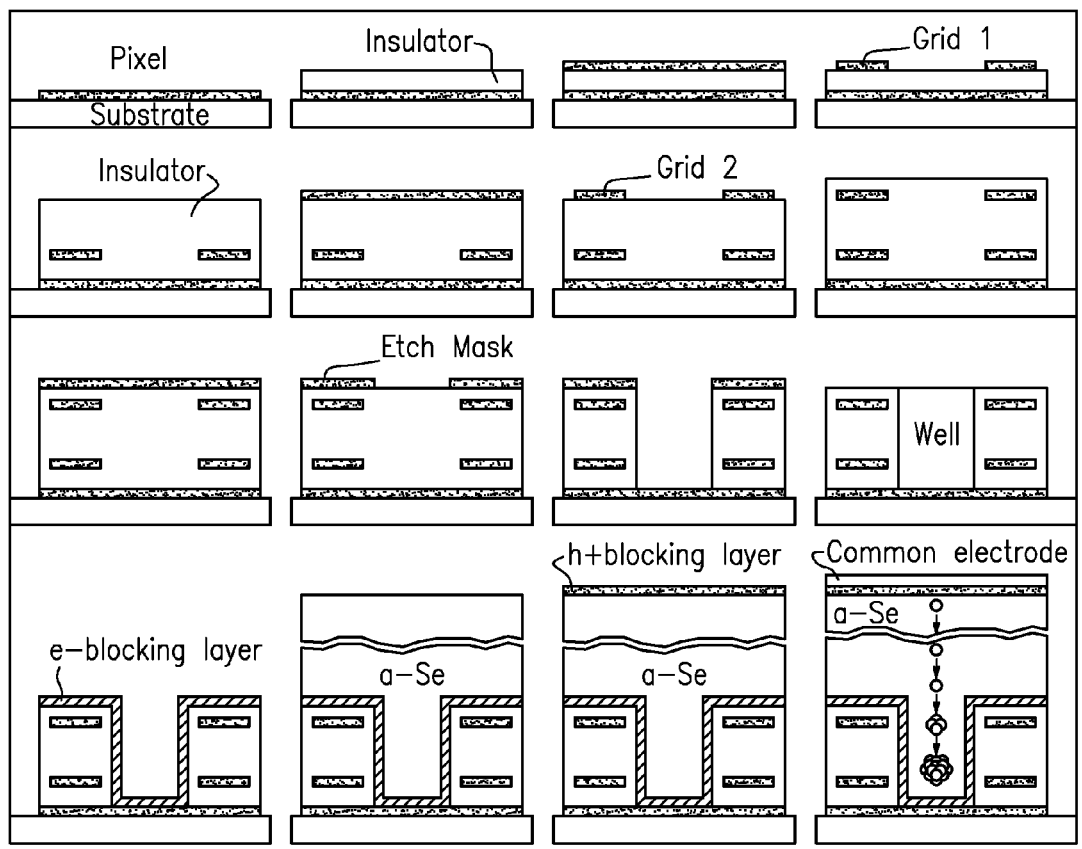
FIG. 3 illustrates steps to fabricate a field-Shaping multi-Well Avalanche Detector (SWAD), according to an aspect of the present invention.

FIG. 3 illustrates steps to fabricate the sensor structure, with two dimensional (2D) pixel electrodes being patterned over a substrate using electrode sputtering and optical lithography. An insulating polymer is spin-casted over the 2D pixels electrodes and first grid electrode is sputtered and patterned. The insulating polymer is then spin-casted over first grid electrode and second grid electrode sputtered and patterned. The second grid electrode is coated with an insulating layer and spacing between the grids is dry etched, preferably using reactive ion etching, forming the plurality of wells, which are coated with an electron blocking layer to inhibit charge injection from the pixel electrode to form a multi-well structure, a-Se is evaporated or vacuum deposited over the multi-well structure to form the photoconductive layer, and the common electrode is sputtered as the final layer.

An optional coating of a p-type hole-transport and electron blocking layer (250), preferably formed of either inorganic or organic thin films, e.g., polythiophene and polyvinylcarbozole, is provided on top of the insulator wall of each well, with hole mobility tuned to dissipate trapped charge on the side walls, thereby eliminating any long term memory effects, polarization effects, and space charge perturbation. The hole blocking layer (260) is provided between top bias electrode, i.e., common electrode or high-voltage electrode, and the a-Se to reduce hole injection.

Figure 4A:
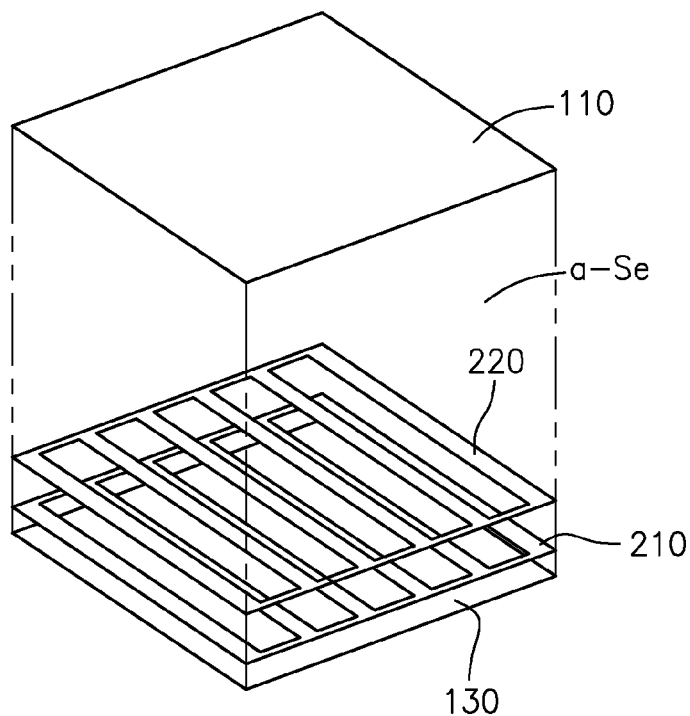
FIG. 4(a) is a schematic representation of a two dimensional (2D) SWAD, according to an aspect of the present invention.
Figure 4B:
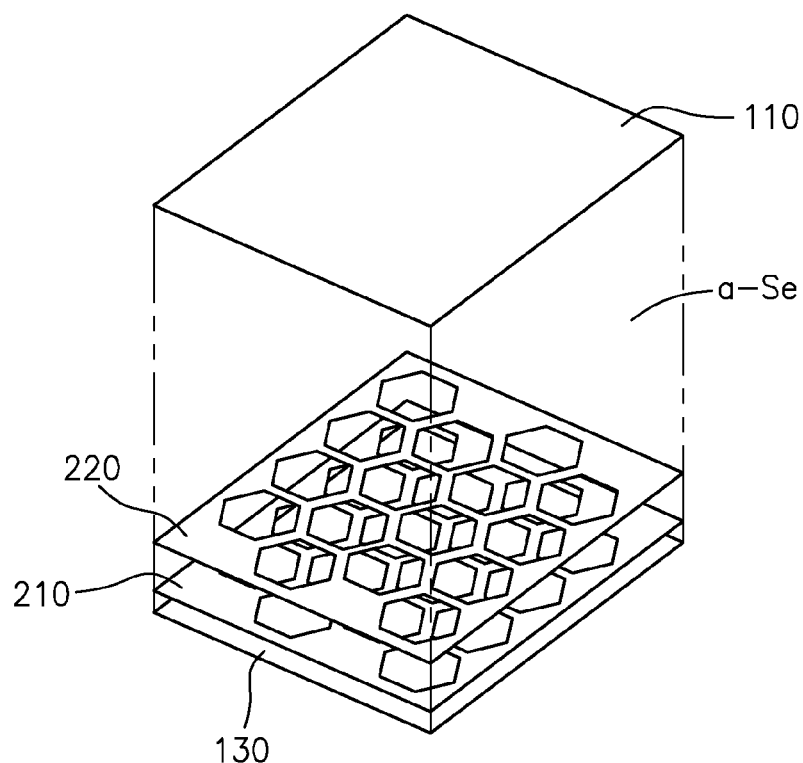
FIG. 4(b) is a schematic representation of a three dimensional (3D) SWAD, according to an aspect of the present invention.
Figure 5A:
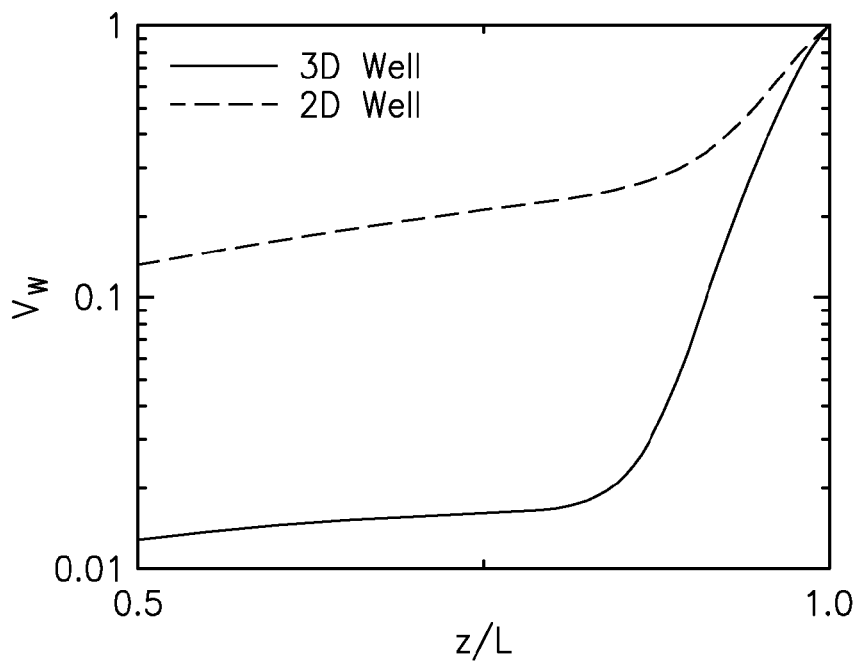
FIGS. 5(a)-5(b) are logarithmic and linear plots, respectively, of a weighting potential distribution for carriers terminating on a pixel electrode within a well.
Figure 5B:
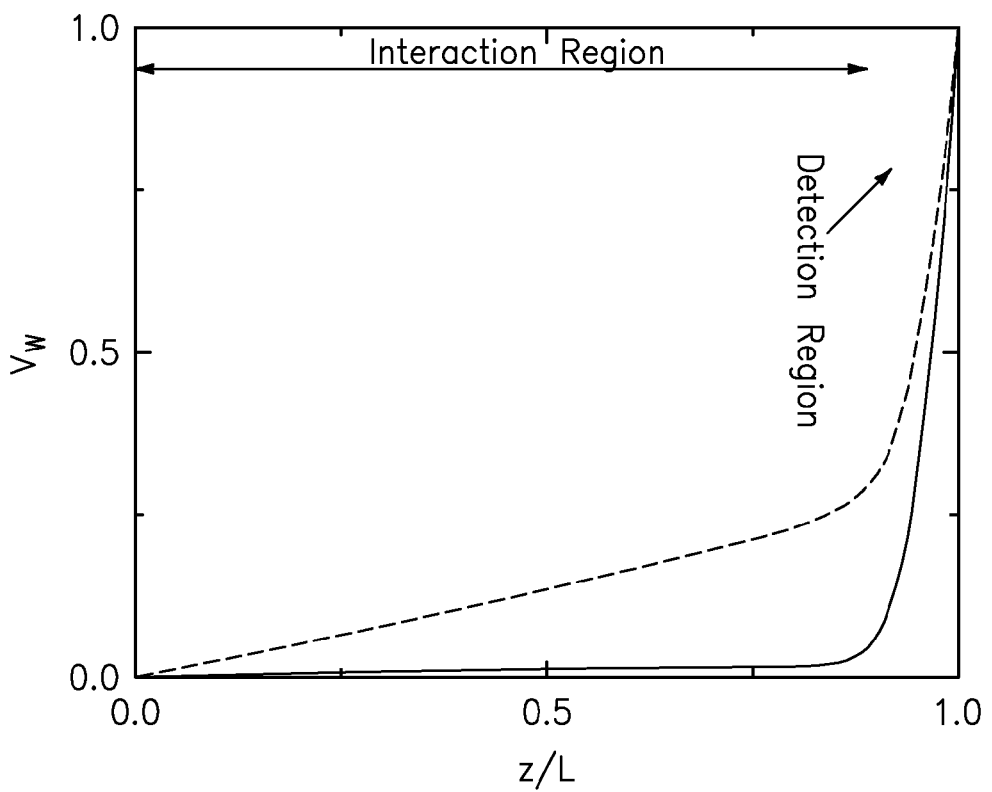

FIGS. 4(*a*)-(*b*) provide schematic representations of 2D and 3D SWADs, with the 2D SWAD having micro-strip grid electrodes and the 3D SWAD having micro-mesh grid electrodes. FIGS. 5(*a*) and 5(*b*) are logarithmic and linear plots, respectively, of a weighting potential distribution ($V_W$) for carriers terminating on a pixel electrode within a well. The weighting potential distribution ($V_W$) is shown and a normalized distance (z/L) are shown on the ordinate and abscissa, respectively, with L being a thickness of the semiconductor film, e.g., thickness of the a-Se layer.

FIGS. 5(*a*)-(*b*) show that the SWAD provides a true unipolar detector, i.e., holes in the a-Se, thereby only being limited by dispersion of a diffusive hole cloud in a detection region formed in the plurality of wells (140, 142). The detection region is the region within the well where the carriers avalanche and are collected by the pixel electrode (130), as shown in FIGS. 2(*a*)-(*b*) by the increased amplification as the charge cloud travels from common electrode (110) to pixel electrode (130). In the interaction region, which can slightly overlap the detection region, high energy radiation is absorbed and converted directly to electric charge. Avalanche multiplication gain occurs due to impact ionization, in which a carrier of sufficiently high energy frees up additional electron hole pairs.

Figure 6:
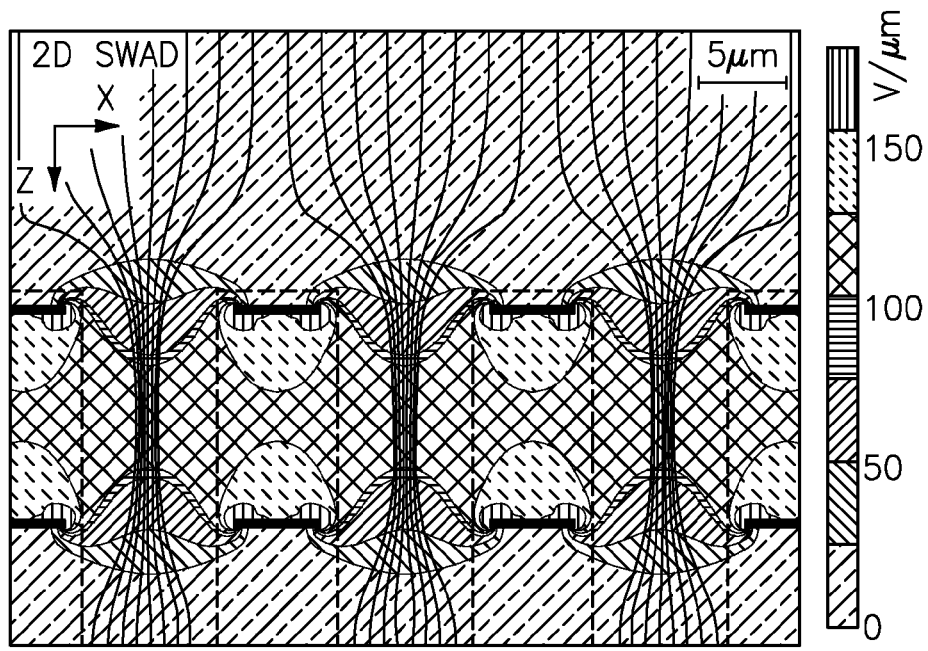
FIG. 6 is an electric field plot showing streamlines for the 2D SWAD according to an aspect of the present invention.

FIG. 6 is an electric field plot showing streamlines for the 2D SWAD, in which a cross-sectional cut is made across a center of the wells and the 2D SWAD has a photoconductive film thickness L of 200 μm, a strip width of 5 μm, and a pitch of 15 μm. In an aspect of the present invention, the separation of the grids from the pixel is 7 μm for first grid electrode (210) and 20 μm for the second grid electrode (220).

Figure 7:
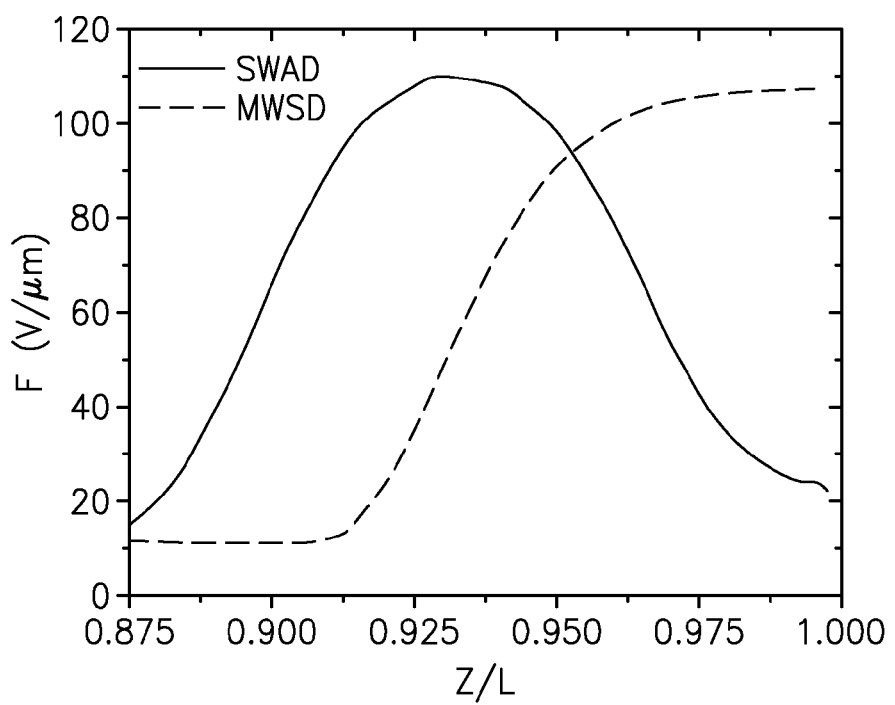
FIG. 7 is a chart showing semi-Gaussian field-shaping in the SWAD according to an aspect of the present invention compared to the MWSD.

FIG. 7 is a chart showing semi-Gaussian field-shaping in the SWAD compared to the MWSD, showing mean electric field distribution F inside each well as a function of normalized depth z/L. A maximum field for the MWSD occurs at the pixel electrode, increasing dark current and making the detector susceptible to breakdown. With the SWAD, however, a semi-Gaussian field shaping is achieved where the electric field at the electrode interface can be as low as one tenth of its peak value, thereby confining avalanche multiplication between the grid planes and minimizing charge injection. Furthermore, the field shaping operation does not compromise the avalanche gain $g_{av}$ and, as shown in FIG. 8, $g_{av}$ is the same for both structures considering identical peak field values (i.e., 110 V/μm).

Figure 8:
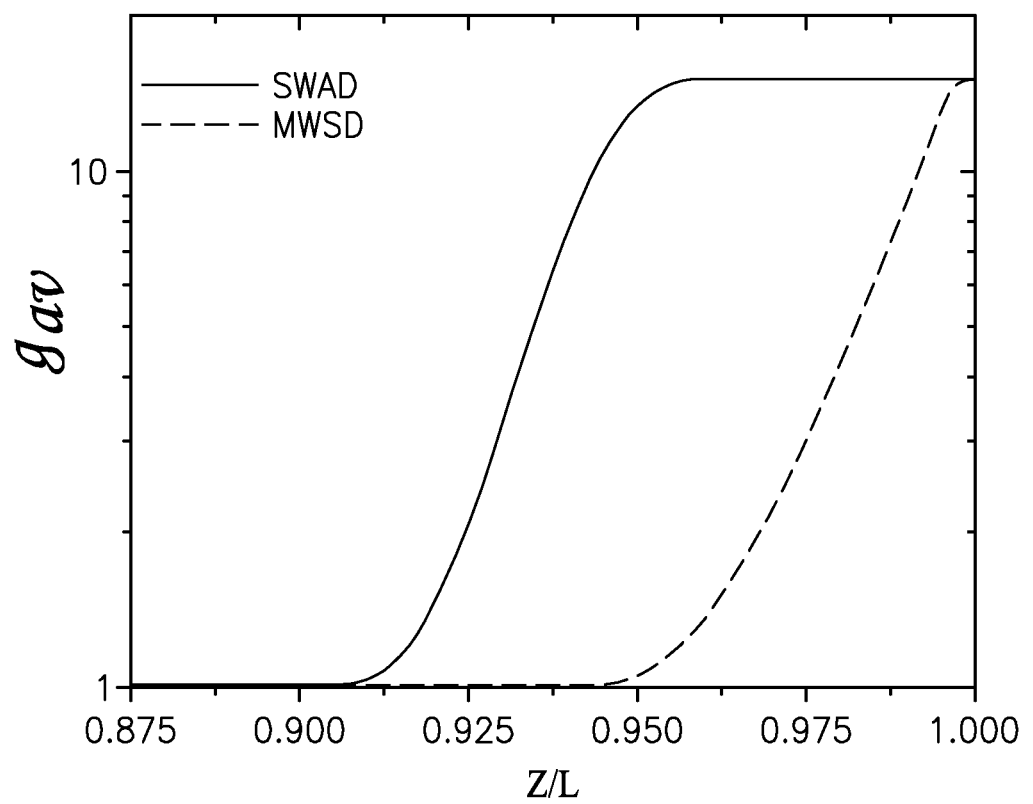
FIG. 8 is a chart of mean avalanche multiplication gain in each well of the SWAD according to an aspect of the present invention compared to the MWSD.

FIG. 8 shows mean avalanche multiplication gain in each well, showing that a direct conversion a-Se detector with avalanche gain can be applied to conventional flat panel detector as an energy integration detector with avalanche gain varied or completely turned off by changing potential between the first and second grids to enable a higher dynamic range. The unipolar charge sensing property of the SWAD allows photon-counting detection using a-Se with improved time resolution compared to non-unipolar or bipolar charge sensing a-Se, and avalanche gain allows improved energy resolution compared to non-avalanche direct conversion a-Se detectors.

The field-shaping aspect of the present invention eliminates formation of field hot spots at metal-semiconductor interfaces with uni-polar time-differential property and avalanche multiplication gain. Avalanche multiplication gains as high as 103 have been achieved inside each well with fields as low as 40 V/μm at the selenium-collector interface. In addition, an aspect of the present invention allows for programmable, order of magnitude higher, gain of a-Se direct conversion detector without increasing bias voltage, achieved through avalanche multiplication gain in a small fraction of the thickness of the layer, e.g., 10 microns of a 1000 micron layer.

Accordingly, an aspect of the present invention provides a detector that includes a common electrode (110), a pixel electrode (130), a plurality of insulators (150), a plurality of wells (140, 142) and a substrate (160), with amorphous selenium (a-Se) separating the plurality of insulators (150) from the common electrode (110) and a-Se filling the plurality of wells (140, 142) that are positioned between the plurality of insulators. The plurality of wells preferably form a honeycomb mesh, which is a three dimensional mesh. In addition, a plurality of first grid electrodes (210) and a plurality of second grid electrodes (220) are provided, with a pair of a first grid electrode (210) and a second grid electrode (220) provided within each of the plurality of insulators (150). The plurality of first grid electrodes (210) and the plurality of second grid electrodes (220) form micro-strip grids with the plurality of wells therebetween. In an aspect of the present invention, the plurality of first grid electrodes (210) form a first conductive grid plane, with the plurality of second grid electrodes (220) form a second conductive grid plane, and avalanche gain is provided by shaping an electric field within the plurality of wells (140, 142) by controlling polarity between the first conductive grid plane and the second conductive grid plane. After avalanche gain, the electric field is defocused at a selenium-pixel interface to eliminate excessive charge injection from the pixel electrode.

Two or more conductive grid/mesh planes are preferably insulated by an insulator to avoid the formation of field hot-spots within selenium, with field hot-spots within selenium causing excessive current and irreversible damage to the detector. The two or more conductive grid/mesh planes are used to bend and steer the electric field lines from a drift bulk region into the respective wells, with the field-line steering avoiding signal charge landing on insulating side walls, which would otherwise cause memory artifacts, e.g., lag and ghosting, polarization effects, and space charge perturbation.

An aspect of the present invention provides a method for detection utilizing a detector that includes a common electrode (110), a pixel electrode (130), a plurality of insulators (150), a plurality of wells (140, 142), and a substrate (160), in which amorphous selenium (a-Se) separates the plurality of insulators (150) from the common electrode (110), the a-Se fills the plurality of wells (140, 142), a pair of a first grid electrode (210) and a second grid electrode (220) is provided within each of the plurality of insulators (150), a plurality of first grid electrodes (210) form a first conductive grid plane and a plurality of second grid electrodes (220) form a second conductive grid plane, and avalanche gain is provided by shaping an electric field within the plurality of wells (140, 142) by controlling electric potentials, i.e., voltages, between the first conductive grid plane and the second conductive grid plane.

Accordingly, aspects of the present invention provide advantages over conventional direct conversion x-ray flat panel imagers that include additional gain through impact ionization, thus allowing the detection of a single x-ray photon, and improved temporal performance through unipolar sensing. These advantages and features allow quantum noise limited performance for conventional x-ray integration detection to be performed to a single x-ray photon level, and enable photon counting with excellent energy resolution and high count rate, thereby allowing spectral imaging detectors made at reduced cost compared to single crystalline Cadmium Telluride (CdTe). These features are advantageous for applications that include mammographic clinical applications.

An aspect of the present invention provides a three-terminal radiation detector with a 2D electrostatic shield and segmented pixel electrode for uni-polar time-differential response and avalanche multiplication gain. The combination of the time-differential and avalanche-multiplication properties of the disclosed detector provides sufficient timing and energy resolutions to enable photon-counting mode radiation detection with applications ranging from high-energy, nuclear, and astrocrystallography. Furthermore, advances in nano-electronics can be applied to pattern high resolution solid-state detectors in the nano-scale with ultra-fast time response, which has applications in optical communications and time-domain spectroscopy. The detector structure disclosed herein achieves stable and continuous avalanche multiplication gain in direct conversion amorphous selenium radiation detectors.

While the invention has been shown and described with reference to certain aspects thereof, it will be understood by those skilled in the art that various changes in form and details may be made therein without departing from the spirit and scope of the present invention as defined by the appended claims and equivalents thereof.

What is claimed is:
1. A detector comprising:
a common electrode;
a pixel electrode;
a plurality of insulators;
a plurality of wells;
a substrate;
a plurality of first grid electrodes;
a plurality of second grid electrodes; and
an electron blocking and hole transport layer provided on the plurality of insulators and the pixel electrode,
wherein amorphous selenium (a-Se) separates the plurality of insulators from the common electrode,
wherein a pair of a first grid electrode and a second grid electrode is provided within each of the plurality of insulators, and wherein the plurality of first grid electrodes and the plurality of second grid electrodes form micro-strip grids with the plurality of wells therebetween.

2. The detector of claim 1, wherein a-Se fills the plurality of wells.

3. The detector of claim 1, wherein the plurality of wells are positioned between the plurality of insulators.

4. The detector of claim 1, wherein the plurality of wells form a honeycomb mesh.

5. The detector of claim 4, wherein the honeycomb mesh is a three dimensional mesh.

6. The detector of claim 1, wherein the plurality of first grid electrodes form a first conductive grid plane,
wherein the plurality of second grid electrodes form a second conductive grid plane, and
wherein avalanche gain is provided by shaping an electric field within the plurality of wells by controlling electric potential between the first conductive grid plane and the second conductive grid plane.

7. The detector of claim 6, wherein, after avalanche gain, the electric field is defocused at a selenium-pixel interface to eliminate excess charge injection from the pixel electrode.

8. The detector of claim 1, further comprising a hole blocking layer between the common electrode and the a-Se.

9. The detector of claim 1, wherein the plurality of wells are smaller than the pixel electrode.

10. A method for detection utilizing a detector that includes a common electrode, a pixel electrode, a plurality of insulators, a plurality of wells, and a substrate,
wherein amorphous selenium (a-Se) separates the plurality of insulators from the common electrode,
wherein the a-Se fills the plurality of wells,
wherein a pair of a first grid electrode and a second grid electrode is provided within each of the plurality of insulators,
wherein a plurality of first grid electrodes form a first conductive grid plane and a plurality of second grid electrodes form a second conductive grid plane,
wherein the plurality of first grid electrodes and the plurality of second grid electrodes form micro-strip grids with the plurality of wells therebetween, and
wherein an electron blocking and hole transport layer is provided on the plurality of insulators and the pixel electrode.

11. The method of claim 10, wherein the plurality of wells are positioned between the plurality of insulators.

12. The method of claim 10, wherein the plurality of wells form a honeycomb mesh.

13. The method of claim 12, wherein the honeycomb mesh is a three dimensional mesh.

14. The method of claim 10, wherein avalanche gain is provided by shaping an electric field within the plurality of wells by controlling polarity between the first conductive grid plane and the second conductive grid plane.

15. The method of claim 14, wherein, after avalanche gain, the electric field is defocused at a selenium-pixel interface to eliminate excess charge injection from the pixel electrode.

* * * * *